US011424252B2

(12) United States Patent
Huang et al.

(10) Patent No.: US 11,424,252 B2
(45) Date of Patent: Aug. 23, 2022

(54) SMALL-AREA AND LOW-VOLTAGE ANTI-FUSE ELEMENT AND ARRAY

(71) Applicant: YIELD MICROELECTRONICS CORP., Chu-Pei (TW)

(72) Inventors: Wen-Chien Huang, Chu-Pei (TW); Yu Ting Huang, Chu-Pei (TW); Chi Pei Wu, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 68 days.

(21) Appl. No.: 17/101,113

(22) Filed: Nov. 23, 2020

(65) Prior Publication Data

US 2022/0102367 A1 Mar. 31, 2022

(30) Foreign Application Priority Data

Sep. 28, 2020 (TW) .................................. 109133605

(51) Int. Cl.
*H01L 23/52* (2006.01)
*H01L 21/82* (2006.01)
*H01L 27/112* (2006.01)

(52) U.S. Cl.
CPC .............................. *H01L 27/11206* (2013.01)

(58) Field of Classification Search
CPC ............... H01L 27/11206; H01L 23/525–5258
USPC ............ 438/131–132, 467; 257/50, 529–530
See application file for complete search history.

(56) References Cited

U.S. PATENT DOCUMENTS

| 6,774,439 B2 | 8/2004 | Fukuzumi et al. |
| 9,123,572 B2 * | 9/2015 | Kurjanowicz .... H01L 27/11206 |
| 9,412,746 B2 | 8/2016 | Yang |
| 10,090,309 B1 * | 10/2018 | Chen ...................... G06F 21/73 |
| 11,094,702 B1 * | 8/2021 | Ou ..................... H01L 27/11206 |
| 11,217,595 B2 * | 1/2022 | Li ......................... H01L 23/5252 |
| 2017/0076757 A1 * | 3/2017 | Wu ........................ G11C 17/16 |
| 2018/0061755 A1 | 3/2018 | Yamamoto et al. |

FOREIGN PATENT DOCUMENTS

| TW | I258840 B | 7/2006 |
| TW | 201539670 A | 10/2015 |

OTHER PUBLICATIONS

Examination Report for corresponding Taiwanese Application No. 109133605, dated Jul. 21, 2021.

* cited by examiner

*Primary Examiner* — Calvin Lee
(74) *Attorney, Agent, or Firm* — Rosenberg, Klein & Lee

(57) ABSTRACT

A small-area and low-voltage anti-fuse element comprises four first gate dielectric layers each two symmetrically distributed; and an anti-fuse gate formed on the first gate dielectric layers, wherein four corners of the anti-fuse gate respectively overlap corners of the first gate dielectric layers, which are closest to the anti-fuse gate; each of the four corners of the anti-fuse gate is fabricated to have at least one sharp angle. The present invention is characterized in that four first gate dielectric layers share an anti-fuse gate and that the sharp angle has a higher density of charges. Therefore, the present invention can greatly reduce the size of elements, lower the voltage required to puncture the first gate dielectric layer, and decrease the power consumption. The present invention also discloses a small-area and low-voltage anti-fuse array.

12 Claims, 6 Drawing Sheets

SMALL-AREA AND LOW-VOLTAGE ANTI-FUSE ELEMENT AND ARRAY

This application claims priority of Application No. 109133605 filed in Taiwan on 28 Sep. 2020 under 35 U.S.C. § 119; the entire contents of all of which are hereby incorporated by reference.

BACKGROUND OF THE INVENTION

Field of the Invention

The present invention relates to an anti-fuse element and array, particularly to a small-area and low-voltage anti-fuse element and array.

Description of the Prior Art

The data of non-volatile memories, including EEPROM and flash memories, are electrically editable and erasable and will not vanish after power is turned off. Therefore, they are extensively used by information and computer industry. However, these read-only-memory and cache memories have complicated structure, low reliability and high fabrication cost. Therefore, the high-reliability and low-cost one-time programmable (OTP) memories are also often used in many situations. The OTP memories are characterized in using fuses and anti-fuses as elements and having high flexibility in application.

The fuses used currently include metal fuses and poly fuses. Using a high energy laser beam or a great current to burn out fuses is the primary writing method of OTP memories. After writing, the resistance the fuse increases, and the power consumption rises. In an anti-fuse, a dielectric layer is interposed between two conductors to form a capacitor. In writing, bias is applied to two conductors to induce breakdown and puncture of the dielectric layer. After writing, the resistance of the anti-fuse decreases. Integrated circuit is developing very fast, and the size thereof is growing smaller and smaller. The technology of using MOS elements to fabricate anti-fuse elements has been developed in recent years, wherein the breakdown mechanism of gate dielectric layers is the primary writing method thereof.

The principle of the abovementioned MOS-based anti-fuse elements is using fractures of gate dielectric layers to form permanent electric conduction paths. The limitation of the technology is that a sufficiently high voltage is needed to induce breakdown of gate dielectric layers. The interface above the gate dielectric layer of the conventional anti-fuse element is normally a planar surface, and charges are evenly distributed on the surface. A high current is needed to acquire a high voltage to puncture a gate dielectric layer. Thus, an element requires a larger area.

SUMMARY OF THE INVENTION

Owing to the abovementioned problems, the primary objective of the present invention is to provides a small-area and low-voltage anti-fuse element and an array thereof, wherein an anti-fuse gate overlaps four gate dielectric layers below the gate, whereby the anti-fuse gate are shared by four gate dielectric layers. Further, sharp angles are formed at the corners where the anti-fuse gate overlaps the gate dielectric layers. In operation, the high-density charges at the sharp angles can decrease the required puncturing voltage. Thus, the present invention can greatly reduce the current required to program the anti-fuse elements and effectively decrease the area of an element.

In order to achieve the abovementioned objective, the present invention proposes a small-area and low-voltage anti-fuse element, which comprises a substrate, four first gate dielectric layers, an anti-fuse gate, and four first ion-doped areas. Each two of four first gate dielectric layers are symmetrically disposed on the substrate. The anti-fuse gate is disposed on four first gate dielectric layers. Four corners of the anti-fuse gate respectively overlap the corners of the first gate dielectric layers, which are closest to the anti-fuse gate, and at least one sharp angle is formed on each corner of the anti-fuse gate. Four first ion-doped areas are respectively formed on four regions of the substrate, which are on the lateral sides of the first gate dielectric layers.

The present invention also proposes a small-area and low-voltage anti-fuse array, which comprises a plurality of parallel bit lines, a plurality of parallel word lines, a plurality of parallel select lines, and a plurality of anti-fuse elements. The plurality of bit lines includes a first bit line. The word lines are vertical to the bit lines and include a first word line and a second word line, which are respectively disposed at two sides of the first bit line. The select lines are parallel to the word lines and include a first select line and a second select line, which respectively neighbor the first word line and the second word line. Each anti-fuse element is connected with two word lines, two select lines, and one bit line. Each anti-fuse element includes a substrate, four first gate dielectric layers, an anti-fuse gate, four first ion-doped areas, and four select transistors. Each two of four first gate dielectric layers are symmetrically formed on the substrate. The anti-fuse gate is formed on four first gate dielectric layers. Four corners of the anti-fuse gate respectively overlap the corners of the first gate dielectric layers, which are closest to the anti-fuse gate, and at least one sharp angle is formed on each corner of the anti-fuse gate. The anti-fuse gate is connected with the first bit line. Four first ion-doped areas are respectively formed on four regions of the substrate, which are on the lateral sides of the first gate dielectric layers. Two first ion-doped areas at the same side of the first bit line are respectively connected with the first select line and the second select line. Four select transistors respectively neighbor four first ion-doped areas. Each select transistor includes a second gate dielectric layer, a select gate, and a second ion-doped area. The second gate dielectric layer is disposed on the substrate. The select gate is stacked over the second gate dielectric layer. The second ion-doped area is formed on a region of the substrate, which is on one lateral side of the second gate dielectric layer and far away from the first ion-doped area. The first ion-doped areas and the second ion-doped areas are doped with the same ion. Two select gates of two select transistors at the same side of the first bit line are respectively connected with the first word line and the second word line. Two second ion-doped areas are respectively connected with the first select line and the second select line.

In one embodiment, if the substrate is a P-type semiconductor substrate, the first ion-doped areas are N-type doped areas; if the substrate is an N-type semiconductor substrate, the first ion-doped areas are P-type doped areas.

In one embodiment, the sharp angle is smaller than or equal to 90 degrees.

In one embodiment, four corners of the anti-fuse gate are respectively fabricated into extension members, and each extension member has two sharp angles.

In one embodiment, the small-area and low-voltage anti-fuse element of the present invention further comprises a well; the well is disposed inside the substrate and below the first ion-doped area; the well is doped with ions, which are different from the ions that the first ion-doped area is doped with.

Below, embodiments are described in details in cooperation with the attached drawings to make easily understood the objectives, technical contents, characteristics and accomplishments of the present invention.

DETAILED DESCRIPTION OF THE INVENTION

Figure 1:
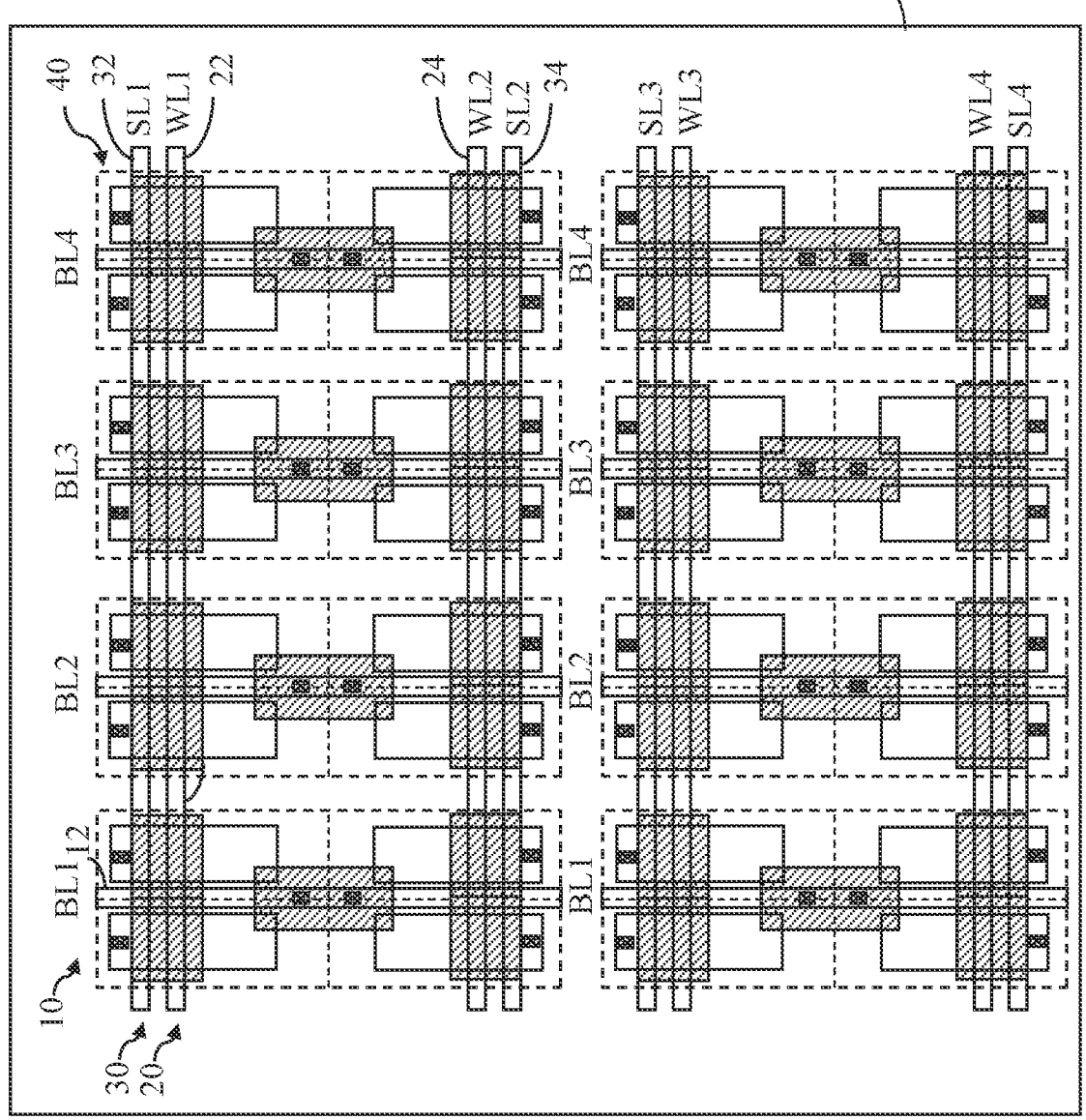
FIG. 1 shows a layout of a small-area and low-voltage anti-fuse array according a first embodiment of the present invention.
Figure 2:
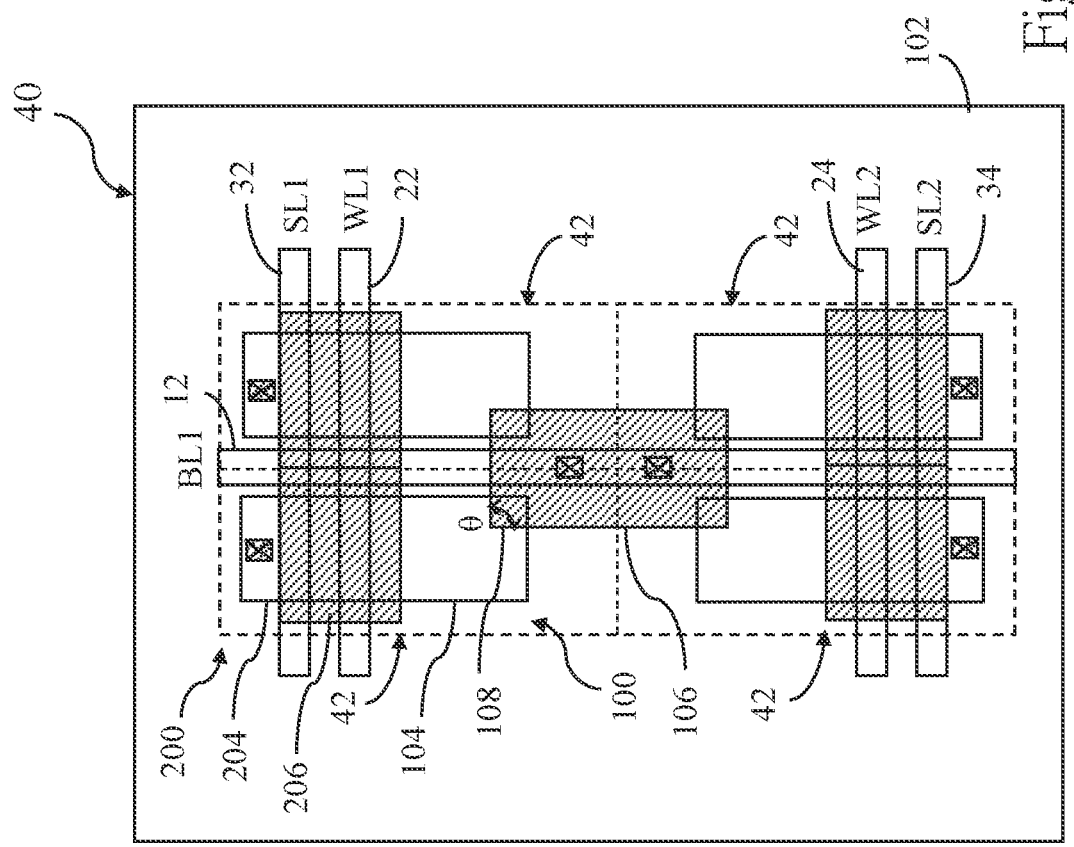
FIG. 2 shows a layout of a small-area and low-voltage anti-fuse element according the first embodiment of the present invention.
Figure 3:
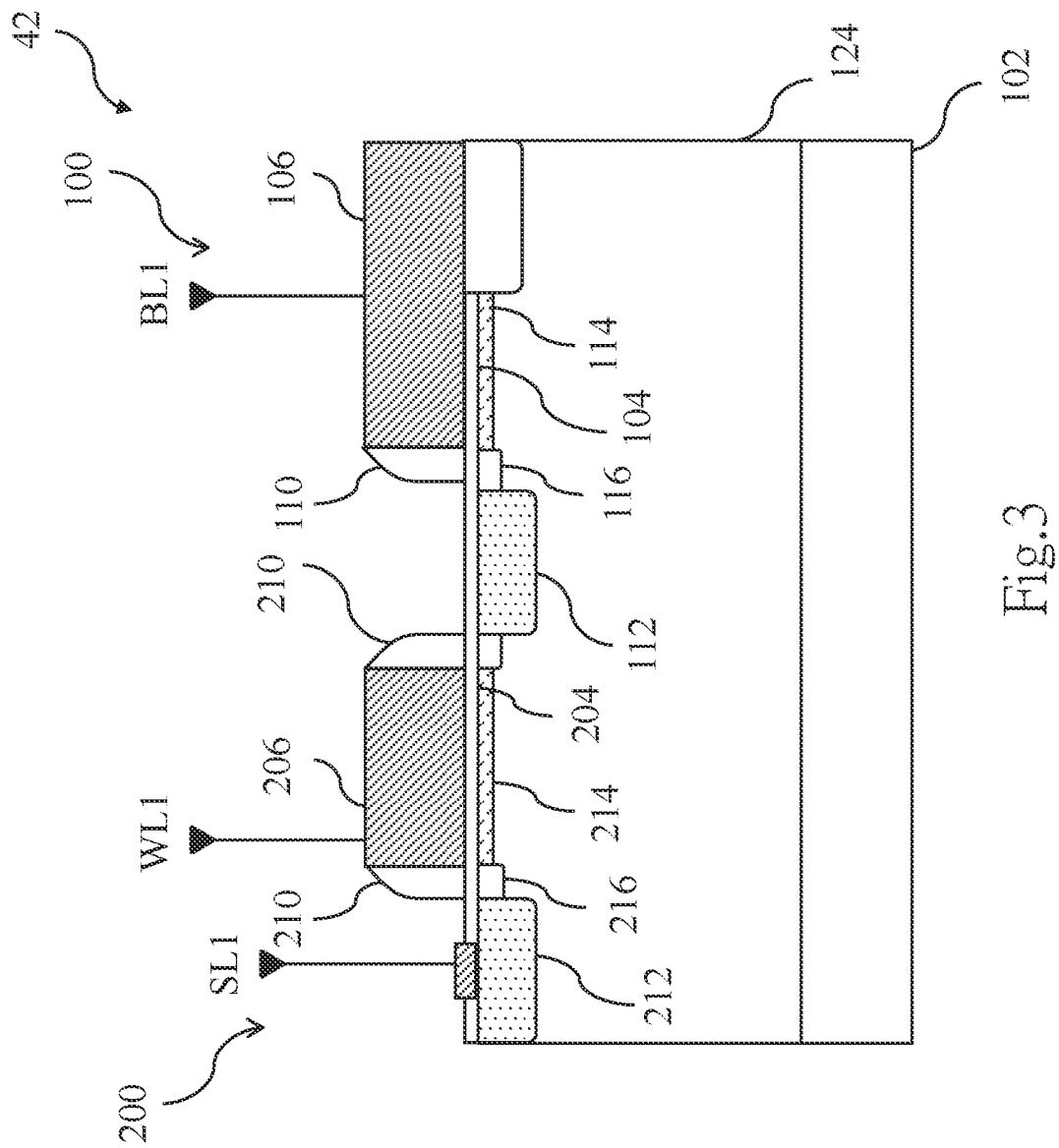
FIG. 3 shows a sectional view of an anti-fuse memory cell according the first embodiment of the present invention.

Refer to FIGS. 1-3 for a first embodiment.

As shown in FIG. 1, the small-area and low-voltage anti-fuse array of the present invention comprises a plurality of parallel bit lines 10, a plurality of parallel word lines 20, a plurality of parallel select lines 30, and a plurality of anti-fuse element 40. The plurality of bit lines 10 includes bit lines BL1 to BL4, and the bit line BL1 is defined as the first bit line 12. The plurality of word lines 20 is vertical to the bit lines 10 and includes word lines WL1 to WL4, wherein the word lines WL1 and WL2 are defined as the first word line 22 and the second word line 24, which are respectively disposed at two sides of the first bit line 12. The plurality of select lines 30 is parallel to the word lines 20 and includes selection lines SL1 to SL4, wherein the selection line SL1 is defined as the first select line 32 neighboring the first word line 22, and the selection line SL2 is defined as the second select line 34 neighboring the second word line 24. The bit lines 10, word lines 20 and select lines 30 are connected with the plurality of anti-fuse elements 40. As shown in FIG. 1, a 4×2 anti-fuse array of anti-fuse elements 40 is used as the exemplification. Each anti-fuse element 40 is connected with two word lines 20; two select lines 30 and a bit line 10. Each anti-fuse element 40 has similar connection relationships with the word lines 20, the select lines 30 and the bit line 10, and the similarity will be described below.

As shown in FIG. 2, in the anti-fuse element 40 of this embodiment, four anti-fuse memory cells 42 are formed in a substrate 102 to form a 2×2 array. Each anti-fuse memory cell 42 includes an anti-fuse transistor 100 and a select transistor 200, wherein the select transistor 200 is disposed in the exterior of the anti-fuse transistor 100 and cascaded to the anti-fuse transistor 100. Each anti-fuse transistor 100 has a first gate dielectric layer 104. In the anti-fuse memory cells 42, each two of four first gate dielectric layers 104 of four anti-fuse transistors 100 are symmetrically disposed in the substrate 102 along the first bit line 12. Four first gate dielectric layers 104 share a common anti-fuse gate 106. Therefore, each of four corners of the anti-fuse gate 106 overlaps one of four corners of one first gate dielectric layer 104, which is closest to the anti-fuse gate 106. The anti-fuse gate 106 is connected with the first bit line 12. A first ion-doped area (not shown in the drawings) of each anti-fuse transistor 100 is connected with one of the first select line 32 and the second select line 34. In details, two first ion-doped areas of the anti-fuse transistors 100 on the same side of the first bit line 12 are respectively connected with the first select line 32 and the second select line 34. In other words, the first ion-doped areas of two anti-fuse transistors 100 in the upper region of FIG. 2 are connected with the first select line 32; the first ion-doped areas of two anti-fuse transistors 100 in the lower region of FIG. 2 are connected with the second select line 34. A select gate 206 of each select transistor 200 is connected with one of the first word line 22 and the second word line 24. In details, two select gates 206 of two select transistors 200 on the same side of the first bit line 12 are respectively connected with the first word line 22 and the second word line 24. In other words, the select gates 206 of two select transistors 200 in the upper region of FIG. 2 are connected with the first word line 22; the select gates 206 of two select transistors 200 in the lower region of FIG. 2 are connected with the second word line 24. A second ion-doped area (not shown in the drawings) of each select transistor 100 is connected with one of the first select line 32 and the second select line 34. In details, two second ion-doped areas of the select transistors 200 on the same side of the first bit line 12 are respectively connected with the first select line 32 and the second select line 34. In other words, two second ion-doped areas of the select transistors 200 in the upper region of FIG. 2 are connected with the first select line 32; two second ion-doped areas of the select transistors 200 in the lower region of FIG. 2 are connected with the second select line 34.

In the present invention, the interface between each of four corners of the anti-fuse gate 106 and one first gate dielectric layer 104 is not fabricated to be a planar surface but is fabricated to be an angled surface. It can be in FIG. 2: each of four corners of the anti-fuse gate 106 is fabricated to have a sharp angle 108. It is preferred: the sharp angle is smaller than or equal to 90 degrees. In practical application, each corner has at least one sharp angle 108. It is preferred: each corner has one sharp angle 108. However, each corner may have several sharp angles 108 in the present invention. Besides, the present invention does not particularly limit the size of the sharp angle 108. The size of the sharp angle 108 may be determined according to the writing voltage and the thickness of the first gate dielectric layer 104.

The present invention uses the abovementioned layout of sharing a common anti-fuse gate 106 to decrease the overall area and greatly reduce the fabrication cost. Refer to FIG. 3 for the detailed structure of the anti-fuse memory cell 42. The anti-fuse transistor 100 and the select transistor 200, which is cascaded to the anti-fuse transistor 100, joint have a well 124 formed above the substrate 102. Each anti-fuse transistor 100 includes a gate dielectric layer 104, a common anti-fuse gate 106, a sidewall separator 110, a first ion-doped area 112, and a channel 114. The first gate dielectric layer 104 is formed on the well 124. The anti-fuse gate 106 is formed on a corner of the first gate dielectric layer 104. The sidewall separator 110 is formed on the sidewall of the anti-fuse gate 106. The first ion-doped area 112 is formed inside the well 124 and on one side of the gate dielectric layer 104 and has a lightly-doped area (LDD) 116, which neighbors the vertical boundary of the first gate dielectric layer 104. Each select transistor 200 includes a second gate dielectric layer 204, a select gate 206, sidewall separators 210, a second ion-doped area 212, and a channel 214. The second gate dielectric layer 204 is formed on the well 124 and connected with the first gate dielectric layer 104. The select gate 206 covers the second gate dielectric layer 204 and has two sidewall separator 210 on two sidewalls thereof. The first ion-doped area 112 is formed on one side of the second gate dielectric layer 204, and the second ion-doped area 212 is formed on the other side of the second gate dielectric layer 204. In other words, the second ion-doped area 212 is formed in a region of the well 124, which is far away from the first ion-doped area 112. The second ion-doped area 212 may have a lightly-doped area (LDD) 216, which neighbors the vertical boundary of the second gate dielectric layer 204. The first ion-doped area 112 and the second ion-doped area 212 may be doped with the same type of ions. The first ion doped area 112 and the well 124 are respectively doped with different types of ions in different doping densities according to the operating voltage.

In one embodiment, the substrate 102 may be a P type or N type semiconductor substrate. While the substrate 102 is a P type semiconductor substrate, the first ion-doped area 112 and the second ion-doped area 212 are N type doped areas, and the well 124 is a P type doped region. While the substrate 102 is an N type semiconductor substrate, the first ion-doped area 112 and the second ion-doped area 212 are P type doped areas, and the well 124 is an N type doped region. The first gate dielectric layer 104 is under the anti-fuse gate 106. The first gate dielectric layer 104 is thinner and made of a gate oxide having a relatively uniform thickness. The first gate dielectric layer 104 may be made of a material selected from a group including oxide layers, nitride layers, oxynitride layers, metal oxide layers, and combinations thereof. The anti-fuse element 40 of the abovementioned embodiments may be fabricated in any standard CMOS process, including a sidewall separator formation procedure, a lightly-doping procedure, and a gate silicification procedure. The second gate dielectric layer 204 and the first gate dielectric layer 104 are formed at the same time and have substantially the same structure. However, the second gate dielectric layer 204 and the first gate dielectric layer 104 may have the same or different thicknesses.

In a writing operation, the first select line 32 or the second select line 34 is grounded to select the anti-fuse memory cell 42 in the upper row or lower row of the array; next, a low voltage is applied to the first bit line 12, and a low voltage is also applied to the first word line 22 or the second word line 24, whereby to select a specified anti-fuse memory cell 42 in one row of the array. Then, the first gate dielectric layer 104 is punctured. Each corner of the anti-fuse gate 106 has at least one sharp angle 108. According to the point discharge principle, the charges concentrate at the sharp angle 108. Thus, the sharp angle 108 has a stronger electric field. Thereby is decreased the voltage required to induce puncture in a portion of the first gate dielectric layer 104 below the sharp angle 108. Therefore, the first gate dielectric layer is more likely to puncture, and the time for writing is shortened.

Figure 4:
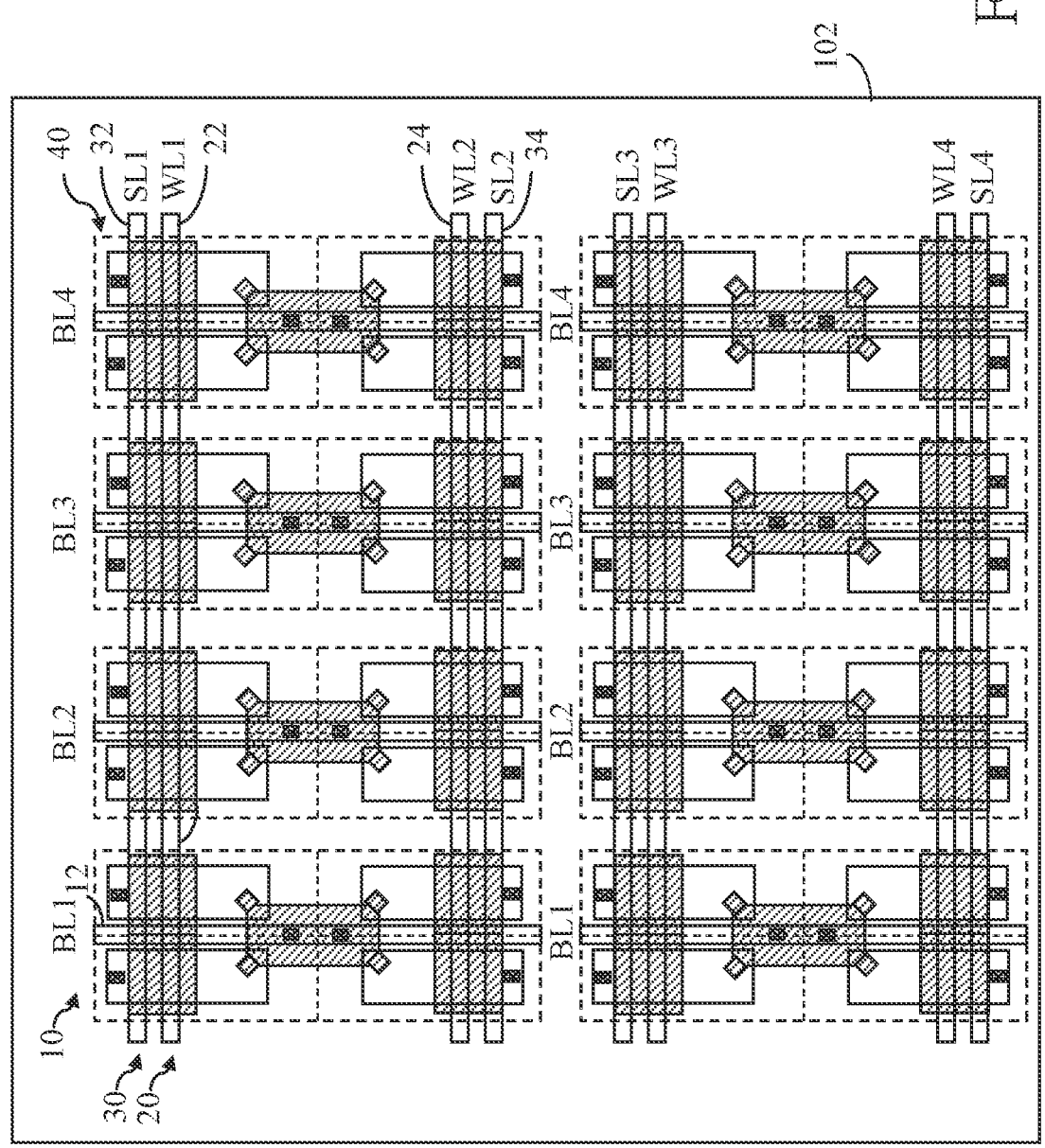
FIG. 4 shows a layout of a small-area and low-voltage anti-fuse array according a second embodiment of the present invention.
Figure 5:
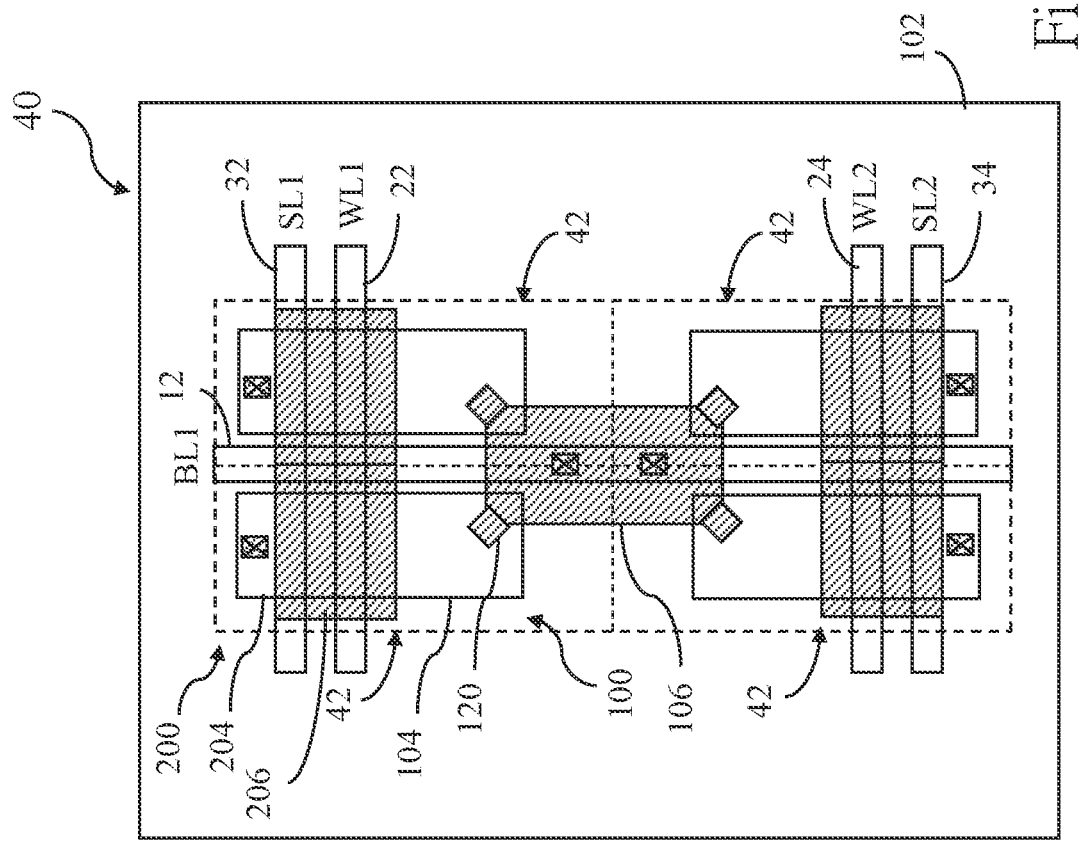
FIG. 5 shows a layout of a small-area and low-voltage anti-fuse element according the second embodiment of the present invention.
Figure 6:
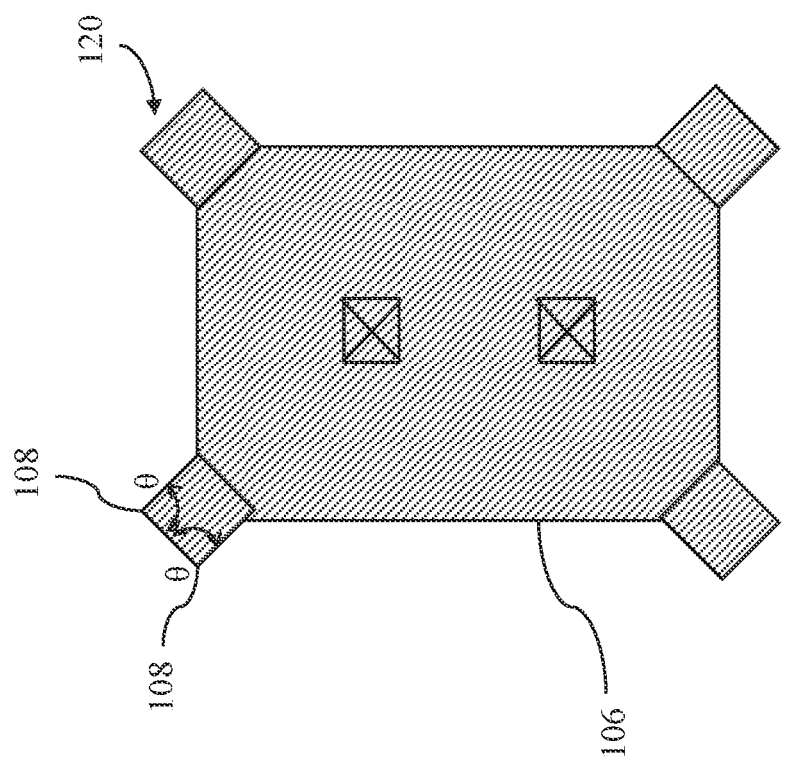
FIG. 6 shows a top view of an anti-fuse gate according the second embodiment of the present invention.

Refer to FIGS. 4-6 for a second embodiment.

The second embodiment is different from the first embodiment in that each corner of the anti-fuse gate 106 has an extension member 120 in the second embodiment. As shown in FIG. 4, in the second embodiment, the small-area and low-voltage anti-fuse array also comprises a plurality of parallel bit lines 10, a plurality of parallel word lines 20, a plurality of parallel select lines 30, and a plurality of anti-fuse element 40. The plurality of bit lines 10 includes bit lines BL1 to BL4, and the bit line BL1 is defined as the first bit line 12. The plurality of word lines 20 is vertical to the bit lines 10 and includes word lines WL1 to WL4, wherein the word lines WL1 and WL2 are defined as the first word line 22 and the second word line 24, which are respectively disposed at two sides of the first bit line 12. The plurality of select lines 30 is parallel to the word lines 20 and includes selection lines SL1 to SL4, wherein the selection line SL1 is defined as the first select line 32 neighboring the first word line 22, and the selection line SL2 is defined as the second select line 34 neighboring the second word line 24. The bit lines 10, word lines 20 and select lines 30 are connected with the plurality of anti-fuse elements 40. As shown in FIG. 4, a 4×2 anti-fuse array of the anti-fuse elements 40 is used as the exemplification. Each anti-fuse element 40 is connected with two word lines 20; two select lines 30 and a bit line 10. Each anti-fuse element 40 has similar connection relationships with the word lines 20, the select lines 30 and the bit line 10, and the similarities will be described below.

As shown in FIG. 5, in the anti-fuse element 40 of this embodiment, four anti-fuse memory cells 42 are formed in a substrate 102 to form a 2×2 array. Each anti-fuse memory cell 42 includes an anti-fuse transistor 100 and a select transistor 200, wherein the select transistor 200 is disposed in the exterior of the anti-fuse transistor 100 and cascaded to the anti-fuse transistor 100. Each anti-fuse transistor 100 has a first gate dielectric layer 104. In the anti-fuse memory cells 42, each two of four first gate dielectric layers 104 of four anti-fuse transistors 100 are symmetrically disposed in the substrate 102 along the first bit line 12. Four first gate dielectric layers 104 share a common anti-fuse gate 106. Therefore, each of four corners of the anti-fuse gate 106 overlaps one corner of one first gate dielectric layer 104, which is closest to the anti-fuse gate 106. The anti-fuse gate 106 is connected with the first bit line 12. A first ion-doped area (not shown in the drawings) of each anti-fuse transistor 100 is connected with one of the first select line 32 and the second select line 34. In details, two first ion-doped areas of the anti-fuse transistors 100 on the same side of the first bit line 12 are respectively connected with the first select line 32 and the second select line 34. In other words, the first ion-doped areas of two anti-fuse transistors 100 in the upper region of FIG. 5 are connected with the first select line 32; the first ion-doped areas of two anti-fuse transistors 100 in the lower region of FIG. 5 are connected with the second select line 34. A select gate 206 of each select transistor 200 is connected with one of the first word line 22 and the second word line 24. In details, two select gates 206 of two select transistors 200 on the same side of the first bit line 12 are respectively connected with the first word line 22 and the second word line 24. In other words, the select gates 206 of two select transistors 200 in the upper region of FIG. 5 are connected with the first word line 22; the select gates 206 of two select transistors 200 in the lower region of FIG. 5 are connected with the second word line 24. A second ion-doped area (not shown in the drawings) of each select transistor 100 is connected with one of the first select line 32 and the second select line 34. In details, two second ion-doped areas of the select transistors 200 on the same side of the first bit line 12 are respectively connected with the first select line 32 and the second select line 34. In other words, two second ion-doped areas of the select transistors 200 in the upper region of FIG. 5 are connected with the first select line 32;

two second ion-doped areas of the select transistors 200 in the lower region of FIG. 5 are connected with the second select line 34.

Refer to FIG. 6. In this embodiment, four corners of the anti-fuse gate 106 respectively have extension members 120 protruding outward. Each extension member 120 has two sharp angles 108. It is preferred: each sharp angle 108 is smaller than or equal to 90 degrees. According to point discharge principle, massive charges concentrate at the sharp angles 108. Thereby is decreased the voltage required to induce puncture in a portion of the first gate dielectric layer 104 below the sharp angles 108. Therefore, the first gate dielectric layer is more likely to puncture, and the time for writing is shortened.

The sectional view and operation method of the anti-fuse memory cell of the second embodiment are similar to those of the first embodiment and will not repeat herein. The layouts of the small-area and low-voltage anti-fuse element and the array thereof are also characterized in sharing a common anti-fuse gate, whereby to decrease the overall area and reduce the fabrication cost.

In conclusion, the present invention proposes a small-area and low-voltage anti-fuse element and an array of the same, wherein a voltage is used to puncture a gate dielectric layer to form a conductive path. In the conventional anti-fuse element, the boundary in the upper region of the dielectric layer of the anti-fuse gate is normally a flattened plane where charges are evenly distributed. Thus, high voltage and high current is required for operation. Hence, the conventional anti-fuse element would have a large area. The small-area and low-voltage anti-fuse element and array of the present invention has following characteristics outperforming the conventional anti-fuse element: the anti-fuse gate are shared by four gate dielectric layers; the interface between the anti-fuse gate and the gate dielectric layer is fabricated to have sharp angles, wherefore charges concentrate at sharp angles, whereby the region of the gate dielectric layer below the sharp angles can be punctured easily. Thus is decreased puncture voltage and reduced power consumption. Further, the present invention can decrease the area of the anti-fuse gate, reduce the element size, and lower the fabrication cost.

The embodiments described above are to demonstrate the technical thoughts and characteristics of the present invention and enable the persons skilled in the art to understand, make, and use the present invention. However, these embodiments are not intended to limit the scope of the present invention. Any equivalent modification or variation according to the spirit of the present invention is to be also included by the scope of the present invention.

What is claimed is:

1. A small-area and low-voltage anti fuse element, comprising:
   a substrate;
   four first gate dielectric layers, each two formed symmetrically on said substrate;
   an anti fuse gate, disposed on said first gate dielectric layers, wherein four corners of said same anti fuse gate respectively overlap corners of said first gate dielectric layers, which are closest to said anti fuse gate; each of said four corners of said anti fuse gate is fabricated to have at least one sharp angle;
   four first ion-doped areas, each formed in a region of said substrate, which is in one side of one said first gate dielectric layer;
   four select transistors, which respectively neighbor said first ion-doped areas, wherein each of said select transistors includes a second gate dielectric layers, formed on said substrate;
   a select gate, stacked over said second dielectric layer; and
   a second ion-doped area, formed in a region of said substrate, which is in one side of said second gate dielectric layer, wherein said one side of said second dielectric layer is far away from said first ion-doped area, and said second ion-doped area and said first ion-doped area are doped with an identical type of ions.

2. The small-area and low-voltage anti-fuse element according to claim 1 further comprising a well, which is formed in said substrate and under said first ion-doped area, wherein said well and said first ion-doped areas are respectively doped with different types of ions.

3. The small-area and low-voltage anti-fuse element according to claim 1, wherein each of said four corners of said anti-fuse gate has an extension member; each said extension member has two sharp angles.

4. The small-area and low-voltage anti-fuse element according to claim 1, wherein said substrate is an N-type semiconductor substrate; said first ion-doped areas are P-type doped areas.

5. The small-area and low-voltage anti-fuse element according to claim 1, wherein said substrate is a P-type semiconductor substrate; said first ion-doped areas are N-type doped areas.

6. The small-area and low-voltage anti-fuse element according to claim 1, wherein said sharp angle is smaller than or equal to 90 degrees.

7. A small-area and low-voltage anti-fuse array, comprising
   a plurality of parallel bit lines, including a first bit line;
   a plurality of parallel word lines, vertical to said bit lies, and including a first word line and a second word line, which are respectively disposed on two sides of said first bit line;
   a plurality of parallel select lines, parallel to said word lines, and including a first select line and a second select line, which respectively neighbor said first word line and said second word line;
   a plurality of anti-fuse elements, wherein each said anti-fuse element is connected with two said word lines, two said select lines and one said bit line, and including
   four first gate dielectric layers, each two formed symmetrically on a substrate along said first bit line;
   an anti-fuse gate, disposed on said first gate dielectric layer, wherein four corners of said anti-fuse gate respectively overlap corners of said first gate dielectric layers, which are closest to said anti-fuse gate; each of said four corners of said anti-fuse gate is fabricated to have at least one sharp angle; said anti-fuse gate is connected with said first bit line;
   four first ion-doped areas, each formed in a region of said substrate, which is in one side of one said first gate dielectric layer; two said first ion-doped areas on the same side of said first bit line are respectively connected with said first select line and said second select line; and
   four select transistors, respectively neighboring said first ion-doped areas, and each including
     a second gate dielectric layer, formed on said substrate;
     a select gate, stacked over said second gate dielectric layer; and a second ion-doped area, formed in a region of said substrate, which is in one side of said second gate dielectric layer, wherein said one side of said second dielectric layer is far away from said first ion-doped area; said second ion-doped area and said first ion-doped area are doped with an identical type of ions;

wherein two said select gates of two said select transistors on the same side of said first bit line are respectively connected with said first word line and said second word line;

two said second ion-doped areas on the same side of said first bit line are respectively connected with said first select line and said second select line.

8. The small-area and low-voltage anti-fuse array according to claim 7 further comprising a well, which is formed in said substrate and under said first ion-doped area, wherein said well and said first ion-doped areas are respectively doped with different types of ions.

9. The small-area and low-voltage anti-fuse array according to claim 7, wherein each of said four corners of said anti-fuse gate has an extension member; each said extension member has two sharp angles.

10. The small-area and low-voltage anti-fuse array according to claim 7, wherein said substrate is an N-type semiconductor substrate; said first ion-doped areas are P-type doped areas.

11. The small-area and low-voltage anti-fuse array according to claim 7, wherein said substrate is a P-type semiconductor substrate; said first ion-doped areas are N-type doped areas.

12. The small-area and low-voltage anti-fuse array according to claim 7, wherein said sharp angle is smaller than or equal to 90 degrees.

\* \* \* \* \*